United States Patent
Zhang et al.

(10) Patent No.: US 11,839,092 B2
(45) Date of Patent: Dec. 5, 2023

(54) DISPLAY SUBSTRATE WITH DISPLAY REGIONS OF DIFFERING LIGHT TRANSMITTANCE, DISPLAY PANEL AND DISPLAY DEVICE

(71) Applicant: KunShan Go-Visionox Opto-Electronics Co., Ltd., Kunshan (CN)

(72) Inventors: Lu Zhang, Kunshan (CN); Miao Chang, Kunshan (CN); Ji Xu, Kunshan (CN); Meijin Li, Kunshan (CN); Junhui Lou, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 412 days.

(21) Appl. No.: 17/363,587

(22) Filed: Jun. 30, 2021

(65) Prior Publication Data

US 2021/0327967 A1    Oct. 21, 2021

Related U.S. Application Data

(63) Continuation of application No. PCT/CN2020/072252, filed on Jan. 15, 2020.

(30) Foreign Application Priority Data

Jun. 28, 2019    (CN) .......................... 201921000966.X

(51) Int. Cl.
*H10K 59/121* (2023.01)
*H10K 50/86* (2023.01)
(Continued)

(52) U.S. Cl.
CPC ........... *H10K 59/121* (2023.02); *H10K 50/86* (2023.02); *H10K 59/1315* (2023.02);
(Continued)

(58) Field of Classification Search
CPC .................................................... H10K 59/121
(Continued)

(56) References Cited

U.S. PATENT DOCUMENTS

| 10,580,848 B1 | 3/2020 | Ma et al. | |
| 11,769,448 B2 * | 9/2023 | Mi ........................... | G09G 3/32 345/55 |

(Continued)

FOREIGN PATENT DOCUMENTS

| CN | 108269840 A | 7/2018 |
| CN | 108389879 A | 8/2018 |

(Continued)

OTHER PUBLICATIONS

International Search Report dated Apr. 10, 2020 in corresponding International application No. PCT/CN2020/072252; 5 pages.

(Continued)

*Primary Examiner* — Ajay Arora
(74) *Attorney, Agent, or Firm* — Maier & Maier, PLLC

(57) ABSTRACT

A display substrate includes a substrate, and the display substrate includes a first display region with a greatest light transmittance, a second display region, and a third display region on the substrate, the third display region is contiguous to the first and second display regions. A plurality of first sub-pixels are disposed in the first display region, a plurality of second sub-pixels are disposed in the second display region, a plurality of third sub-pixels are disposed in the third display region, and a density of the second sub-pixels is the greatest. A pixel circuit for the first sub-pixels is disposed in the third display region, a first electrode of the first sub-pixel is electrically connected to a corresponding pixel circuit via a wiring, the wiring includes a first segment (Continued)

of transparent conductive material disposed in the first display region and a second segment disposed in the third display region.

20 Claims, 4 Drawing Sheets

(51) Int. Cl.
    *H10K 59/65*     (2023.01)
    *H10K 59/35*     (2023.01)
    *H10K 59/131*     (2023.01)

(52) U.S. Cl.
    CPC ......... *H10K 59/351* (2023.02); *H10K 59/352* (2023.02); *H10K 59/65* (2023.02)

(58) Field of Classification Search
    USPC .......................................... 257/40
    See application file for complete search history.

(56) References Cited

U.S. PATENT DOCUMENTS

| | | |
|---|---|---|
| 2007/0267973 A1 | 11/2007 | Suh |
| 2020/0058726 A1 | 2/2020 | Ma et al. |
| 2022/0319411 A1* | 10/2022 | Cheng ................... H10K 59/00 |

FOREIGN PATENT DOCUMENTS

| | | |
|---|---|---|
| CN | 108830234 A | 11/2018 |
| CN | 109037298 A | 12/2018 |
| CN | 208861990 U | 5/2019 |
| CN | 110189639 A | 8/2019 |

OTHER PUBLICATIONS

Written Opinion of the International Searching Authority dated Apr. 10, 2020 in corresponding International application No. PCT/CN2020/072252; 7 pages including Partial Machine-generated English-language translation.

* cited by examiner

DISPLAY SUBSTRATE WITH DISPLAY REGIONS OF DIFFERING LIGHT TRANSMITTANCE, DISPLAY PANEL AND DISPLAY DEVICE

CROSS REFERENCE TO RELATED APPLICATIONS

The present application is a continuation application of International Application No. PCT/CN2020/072252 filed on Jan. 15, 2020, which claims priority to Chinese Patent Application No. 201921000966.X, filed on Jun. 28, 2019, both of which are hereby incorporated by reference in their entireties.

TECHNICAL FIELD

This present disclosure relates to a field of display technology, and in particular to a display substrate, a display panel, and a display device.

BACKGROUND

With the rapid development of electronic devices, users have higher and higher requirements on screen-to-body ratio, making full-screen display of electronic devices attract more and more attention in the industry. Traditional electronic devices such as mobile phones and tablet computers need to integrate front cameras, earpieces, infrared sensing elements, etc. Therefore, the screen is notched, such that the camera, the earpieces, the infrared sensing elements and the like may be provided in a notch area, but the notch area cannot be used to display images. Alternatively, holes are provided in the screen to accommodate the camera, the earpieces, the infrared sensing elements, etc., so that external light may enter the photosensitive elements disposed under the screen via the holes on the screen for electronic devices that implement photographing function. These electronic devices are not full-screens in the true sense, and images cannot be displayed in all areas of the entire screen, for example, images cannot be displayed in the camera area.

SUMMARY

According to a first aspect of the embodiments of the present disclosure, a display substrate is provided, and the display substrate includes a substrate. The display substrate includes a first display region, a second display region, and a third display region contiguous to the first display region and the second display region. A light transmittance of the first display region is greater than a light transmittance of the second display region and a light transmittance of the third display region, respectively. The first display region is provided with a plurality of first sub-pixels disposed on the substrate, the second display region is provided with a plurality of second sub-pixels disposed on the substrate, and the third display region is provided with a plurality of third sub-pixels disposed on the substrate, and a density of the plurality of second sub-pixels is greater than a density of the plurality of third sub-pixels and a density of the plurality of first sub-pixels respectively. The first sub-pixel includes a first electrode, a light emitting structure disposed on the first electrode, and a second electrode disposed on the light-emitting structure, a pixel circuit configured to drive the plurality of first sub-pixels is disposed in the third display region, the first electrode of each of the first sub-pixels is electrically connected to a corresponding pixel circuit through a wiring, and the wiring includes a first segment and a second segment which are connected with each other. The first segment is disposed in the first display region, the second segment is disposed in the third display region, and the first segment is made of a transparent conductive material.

According to a second aspect of the embodiments of the present disclosure, a display panel is provided, the display panel includes the above-mentioned display substrate and an encapsulation layer; the encapsulation layer includes a polarizer covering the second display region, or covering the second display region and the third display region, or covering the first display region, the second display region and the third display region. The polarizer can eliminate the reflected light by the surface of the display panel and improve the user experience.

According to a third aspect of the embodiments of the present disclosure, there is provided a display device, including: a device body having a component area; the above-mentioned display panel covering the device body; wherein the component area is disposed below the first display region, and the component area is provided with a photosensitive component that emits or collects light passing through the first display region.

In the display substrate, the display panel, and the display device according to the embodiments of the present disclosure, since the light transmittance of the first display region is greater than the light transmittance of the second display region and the light transmittance of the third display region, respectively, the photosensitive component can be disposed under the first display region to realize full-screen display of the display substrate under the premise of ensuring the proper operation of the photosensitive component. At the same time, because the pixel circuit of the first sub-pixels in the first display region is disposed in the third display region, complexity of the structure of the first display region can be reduced, and the diffraction effect generated in a case that external light is passing through the first display region can be reduced. Therefore, the imaging quality of the camera disposed under the first display region can be improved. The density of the third sub-pixels in the third display region is less than the density of the second sub-pixels in the second display region, so that the third display region has space for the pixel circuit for the first sub-pixel, which is convenient for arrangement of pixel circuits in the third display region.

DETAILED DESCRIPTION OF THE EMBODIMENTS

The exemplary embodiments will be described in detail here, and examples thereof are illustrated in the accompanying figures. When the following description refers to the accompanying figures, unless otherwise indicated, the same reference signs in different drawings designate same or similar elements. Implementation manners described in the following exemplary embodiments do not represent all implementation manners consistent with the present disclosure. Rather, they are only examples of devices that are consistent with some aspects of the disclosure as defined the appended claims.

For smart electronic devices such as mobile phones and tablet computers, since it is necessary to integrate photosensitive components such as front cameras and light sensors, the photosensitive components are typically provided under a transparent display region which is provided in the above-mentioned electronic devices, so as to achieve full-screen display of the electronic devices while guaranteeing proper operation of the photosensitive components.

However, quality of light passing through the transparent display region and collected by the camera is poor, and even image distortion defects may occur during image collecting process. Research by the inventors shows that the reason for this problem is that a structure of the transparent display region of the electronic device is relatively complex, and complex diffraction intensity distribution is generated in a case that external light passes through the transparent display region, resulting in generating diffraction fringes, which affects the proper operations of the photosensitive component.

To solve the above-mentioned problems, embodiments of the present disclosure provide a display substrate, a display panel, and a display device.

The display substrate, the display panel, and the display device according to the embodiments of the present disclosure will be described in detail hereinafter with reference to the accompanying drawings. In a case of no conflict, features of the following embodiments and the implementation manners may be mutually supplemented to each other or combined with each other.

Figure 1:
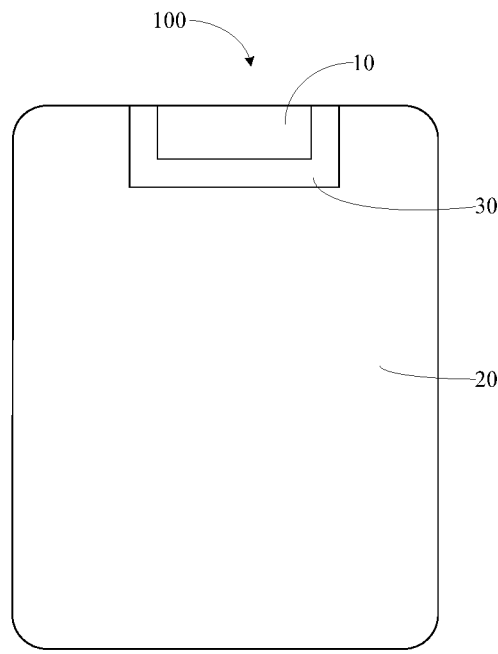
FIG. 1 illustrates a top view of a display substrate according to an embodiment of the present disclosure.

The present disclosure provides a display substrate. Referring to FIG. 1, the display substrate 100 includes a first display region 10, a second display region 20, and a third display region 30 contiguous to the first display region 10 and the second display region 20. A light transmittance of the first display region 10 is greater than a light transmittance of the second display region 20 and a light transmittance of the third display region 30 respectively.

Figure 2:
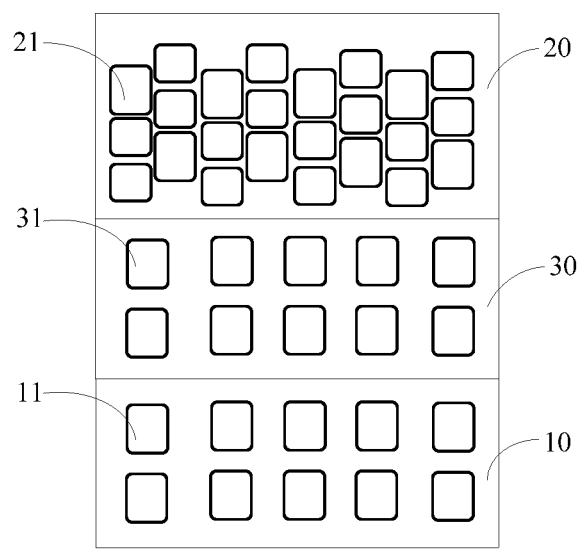
FIG. 2 illustrates a partial schematic diagram of arrangement of sub-pixels in the display substrate as illustrated in FIG. 1.
Figure 3:
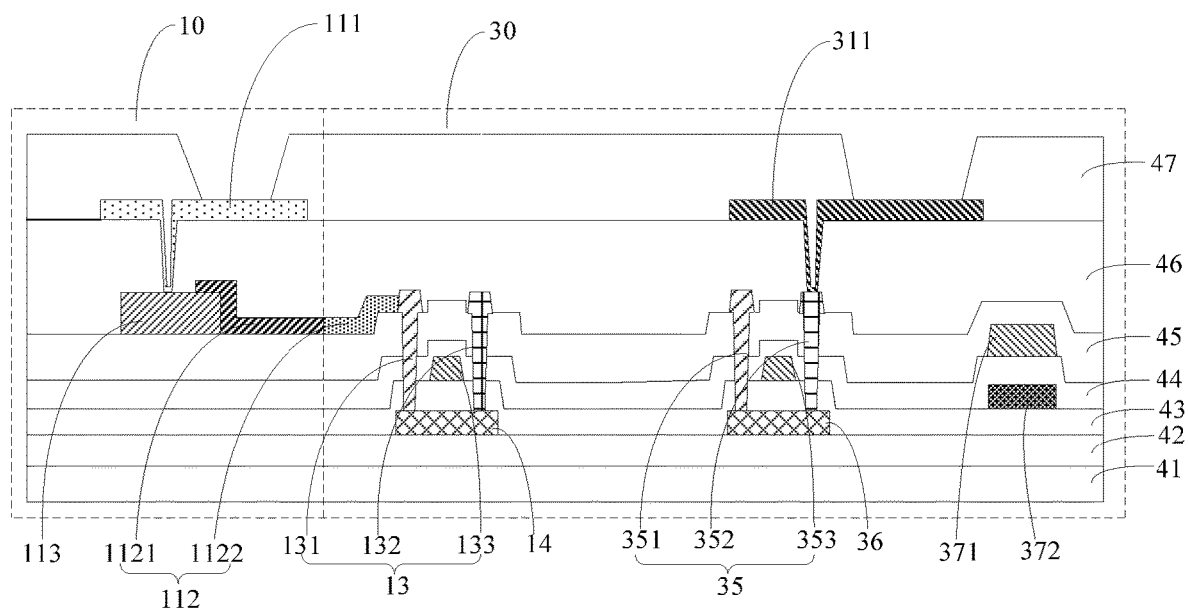
FIG. 3 illustrates a partial cross-sectional view of the display substrate as illustrated in FIG. 1.

Referring to FIGS. 2 and 3, the display substrate 100 includes a substrate 41. The first display region 10 is provided with a plurality of first sub-pixels 11 disposed on the substrate, and the second display region 20 is provided with a plurality of second sub-pixels 21 disposed on the substrate 41, and the third display region 30 is provided with a plurality of third sub-pixels 31 disposed on the substrate 4.

A density of the second sub-pixels 21 is greater than a density of the third sub-pixels 31 and a density of the first sub-pixels 11, respectively.

Referring to FIG. 3, each of the first sub-pixels 11 includes a first electrode 111, a light-emitting structure (not shown) disposed on the first electrode 111, and a second electrode (not shown) disposed on the light-emitting structure. A pixel circuit for driving the first sub-pixel 11 is disposed in the third display region 30, and the first electrode 111 of the first sub-pixel 11 is electrically connected to a corresponding pixel circuit via a wiring 112, and the wiring 112 includes a first segment 1121 and a second segment 1122 which are connected with each other, the first segment 1121 is disposed in the first display region 10, the second segment 1122 is disposed in the third display region 30, and the first segment 1121 is made of a transparent conductive material.

For the display substrate 100 according to the embodiments of the present disclosure, as the light transmittance of the first display region 10 is greater than the light transmittance of the second display region 20 and the light transmittance of the third display region 30 respectively, full-screen display of the display substrate 100 is achieved. As the pixel circuit for the first sub-pixel 11 of the first display region 10 is disposed in the third display region 30, a structural complexity of the first display region 10 may be reduced, and diffraction effect generated by external light passing through the first display region 10 can be mitigated. As the density of the third sub-pixels 31 in the third display region 30 is less than the density of the second sub-pixels 21 in the second display region 20, there is space in the third display region 30 for disposing the pixel circuit for the first sub-pixel 11, which is convenient for arrangement of the pixel circuits in the third display region 30.

In an embodiment of the present disclosure, the pixel circuit for the first sub-pixel 11 may be a 1T circuit, a 2T1C circuit, a 3T1C circuit, a 7T1C circuit, or a 7T2C circuit. The pixel circuit for the second sub-pixel 21 and the pixel circuit for the third sub-pixel 31 may be a 2T1C circuit, a 3T1C circuit, a 3T2C circuit, a 7T1C circuit, or a 7T2C circuit. Wherein T represents a transistor, and C represents a storage capacitor. For example, the 2T1C circuit refers to a pixel circuit including 2 transistors and 1 storage capacitor. Type of the pixel circuit for the first sub-pixel 11, type of the pixel circuit for the second sub-pixel 21, and type of the pixel circuit for the third sub-pixel 31 may be same or different.

Referring to FIG. 3, the third sub-pixel 31 may include a third electrode 311, a light-emitting structure (not shown) disposed on the third electrode 311, and a fourth electrode (not shown) disposed on the light-emitting structure. The second sub-pixel may include a fifth electrode, a light-emitting structure disposed on the fifth electrode, and a sixth electrode disposed on the light-emitting structure. The first electrode 111, the third electrode 311, and the fifth electrode may be anodes, the second electrode, the fourth electrode, and the sixth electrode may be cathodes, and the second electrode, the fourth electrode, and the sixth electrode may be connected to form a planar electrode.

Referring to FIG. 3 again, the display substrate 100 may further include a buffer layer 42 disposed on the substrate 41, a semiconductor layer 36 and a semiconductor layer 14 disposed on the buffer layer 42, a gate insulating layer 43 disposed on the semiconductor layer 36 and the semiconductor layer 14, a capacitor insulating layer 44 disposed on the gate insulating layer 43, an interlayer dielectric layer 45 disposed on the capacitor insulating layer 44, a planarization layer 46 disposed on the interlayer dielectric layer 45, and an pixel-defining layer 47 disposed on the planarization layer 46.

The pixel circuit for the first sub-pixel 11 may include a first transistor 13. The first transistor 13 includes a drain 131, a source 132 and a gate 133. The gate 133 is disposed between the gate insulating layer 43 and the capacitor insulating layer 44. The source 132 and the drain 131 are disposed on the interlayer dielectric layer 45 and are connected to the semiconductor layer 14 through via holes passing through the gate insulating layer 43, the capacitor insulating layer 44 and the interlayer dielectric layer 45. The first electrode 111 is disposed between the planarization layer 46 and the pixel-defining layer 47. The pixel circuit for the first sub-pixel 11 including the first transistor 13 is illustrated in FIG. 3 as an example. The pixel circuit for the first sub-pixel 11 may further include a capacitor.

The pixel circuit for the third sub-pixel 31 may include a second transistor 35 and a second capacitor. The second transistor 35 includes a source 351, a drain 352, and a gate 353. The gate 353 is disposed between the gate insulating layer 43 and the capacitor insulating layer 44. The source 351 and the drain 352 are disposed on the interlayer dielectric layer 45 and are connected to the semiconductor layer 36 through via holes passing through the gate insulating layer 43, the capacitor insulating layer 44 and the interlayer dielectric layer 45. The second capacitor includes an upper electrode plate 371 and a lower electrode plate 372. The upper electrode plate 371 is disposed between the capacitor insulating layer 44 and the interlayer dielectric layer 45, and the lower electrode plate 372 is disposed between the gate insulating layer 43 and the capacitor insulating layer 44. The third electrode 311 is disposed between the planarization layer 46 and the pixel-defining layer 47.

In an embodiment of the present disclosure, referring to FIG. 3, a conductive layer 113 may be further provided in the first display region 10. The first electrode 111 is disposed on the conductive layer 113 and the first segment 1121 of the wiring 112, and the first electrode 111 is electrically connected to the first segment 1121 of the wiring 112 via the conductive layer 113. A resistivity of the conductive layer 113 may be lower than a resistivity of the first electrode 111 and a resistivity of the first segment 1121 of the wiring 112 respectively. The first electrode 111 and the first segment 1121 of the wiring 112 are disposed in the first display region 10, typical material for the first electrode 111 and the first segment 1121 of the wiring 112 are metal oxide, which has a relatively high resistance. In a case that the first electrode 111 is in direct contact with the first segment 1121 of the wiring 112, contact resistance between the first electrode 111 and the first segment 1121 of the wiring 112 is relatively large, and a relatively great amount of heat will be generated during the operation of the first display region 10, which makes the temperature of the display substrate increase, thus, proper operations of the display substrate may be affected, even the first electrode 111 cannot be electrically connected to the first segment 1121 of the wiring 112 effectively. The first electrode 111 is electrically connected to the first segment 1121 of the wiring 112 via the conductive layer 113, that is, the first electrode 111 is not in direct contact with the first segment 1121 of the wiring 112, and the resistivity of the conductive layer 113 is lower than that of the first electrode 111 and that of the first segment 1121 of the wiring 112 respectively, so that contact resistance of elements in the first display region 10 is reduced.

Further, an insulating layer may be disposed between the first electrode 111 and the first segment 1121 of the wiring 112, and a via hole may be provided in the insulating layer, and the first electrode 111 may contact or be connected to the conductive layer 113 through the via hole of the insulating layer.

Further, the conductive layer 113 and the drain 131 of the first transistor 13 may be formed in the same process step. With such a configuration, the conductive layer 113 and the drain 131 of the first transistor 13 may be formed at the same time through the same process step, so that complexity of the manufacturing process for the display substrate 100 can be reduced. Referring to FIG. 3, in this case, the insulating layer between the first electrode 111 and the first segment 1121 of the wiring 112 may be the planarization layer 46. In other embodiment of the present disclosure, the conductive layer 113 may not be formed at the same time with the drain 131 of the first transistor 13. For example, the conductive layer 113 may be formed after the formation of the drain 131 of the first transistor 13, or before the formation of the drain 131 of the first transistor 13.

Further, the first segment 1121 of the wiring 112 and the conductive layer 113 may be lapped. With this arrangement, the first segment 1121 of the wiring 112 and the conductive layer 113 are disposed at a same layer, and there is no need to provide a via hole in the insulating layer to connect the first segment 1121 of the wiring 112 with the conductive layer 113, which can further simplify the manufacturing process.

Further, the second segment 1122 of the wiring 112 and the drain 131 of the first transistor 13 may be formed in a same process step to further simplify the manufacturing process.

In an embodiment of the present disclosure, a light transmittance of the first electrode 111 and/or the first segment 1121 of the wiring 112 may be greater than 70%. Preferably, the light transmittance of the first electrode 111 and/or the first segment 1121 of the wiring 112 may be greater than or equal to 90%. For example, the light transmittance of the first electrode 111 and/or the first segment 1121 of the wiring 112 may be 90%, 95%, etc. Such an arrangement can make the light transmittance of the first display region 10 greater, so that the light transmittance of the first display region 10 can meet requirements of collecting light of the photosensitive component disposed below the first display region 10.

In an embodiment of the present disclosure, material for the first electrode 111 and/or the first segment 1121 of the wiring 112 may include at least one of indium tin oxide, indium zinc oxide, silver-doped indium tin oxide, and silver-doped indium zinc oxide. Preferably, material for the first electrode 111 and/or the first segment 1121 of the wiring 112 can be silver-doped indium tin oxide or silver-doped indium zinc oxide to reduce a resistance of the first electrode 111 and/or the first segment 1121 of the wiring 112 while guaranteeing high light transmittance of the first display region 10.

In an embodiment of the present disclosure, material for the conductive layer 113 may include at least one of molybdenum, titanium, aluminum, magnesium, silver, gold, copper, zinc, chromium, nickel, and tungsten. The above-mentioned materials have low resistivity and relatively stable properties. In a case that the conductive layer 113 and the drain 131 of the first transistor 13 are formed at the same time, the conductive layer 113 and the drain 131 of the first transistor 13 may be a stacked structure, and the conductive layer 113 and the drain 131 of the first transistor 13 may include two titanium film layers and an aluminum film layer disposed between the two titanium film layers. Of course, instead, the conductive layer 113 may be made of other metals.

In an embodiment of the present disclosure, the first segment 1121 and the second segment 1122 of the wiring 112 may be disposed at a same layer, and the first segment 1121 and the second segment 1122 of the wiring 112 may be lapped with each other. Such an arrangement facilitates the connection of the first segment 1121 and the second segment 1122 of the wiring 112.

In an embodiment of the present disclosure, a plurality of first sub-pixels 11 are disposed in the first display region 10, and a first electrode 111 of each first sub-pixel 11 is electrically connected to a corresponding wiring 112 through a conductive layer 113. In an extending direction of the conductive layer 113, a width of the conductive layer 113 may be continuously changed or discontinuously changed, and in a longitudinal direction of the conductive layer 113, a distance between two adjacent conductive layers 113 may be continuously changed or discontinuously changed. With this arrangement, diffraction fringes are generated at different positions between two adjacent conductive layers 113, and intensities of diffraction generated at different positions cancel out each other, thereby effectively reducing the diffraction effect, and thus it is ensured that, for example, an image taken by a camera disposed below the first display region 10 has a high definition.

Further, in the extending direction of the conductive layer 113, an edge of the conductive layer 113 is arc-shaped or wavy shape. By setting the edge of the conductive layer 113 to be arc-shaped or wavy shape, the width of the conductive layer 113 can change continuously or discontinuously, and the distance between two adjacent conductive layers 113 can change continuously or discontinuously. A cross section of the conductive layer 113 has a shape of circle, oval, or the like.

In an embodiment of the present disclosure, the pixel circuit for the first sub-pixel 11 is disposed in an area of the third display region 30 contiguous to the first display region 10, and the pixel circuit for the third sub-pixel 31 is disposed in an area of the third display region 30 contiguous to the second display region 20. With this arrangement, the pixel circuit for the first sub-pixel 11 and the pixel circuit for the third sub-pixel 31 may be reasonably arranged in the third display region 30, so that a distance between the first electrode 111 of the first sub-pixel 11 and its corresponding pixel circuit is short, so that a length of a wiring 112 for connecting the first electrode 111 and its corresponding pixel circuit is short, which helps to reduce the complexity of wiring in the display substrate 100.

In an embodiment of the present disclosure, each first electrode 111 may include at least one electrode block, and the light-emitting structure disposed on the first electrode 111 may include at least one light-emitting structure block correspondingly disposed on the at least one electrode block.

Figure 4:
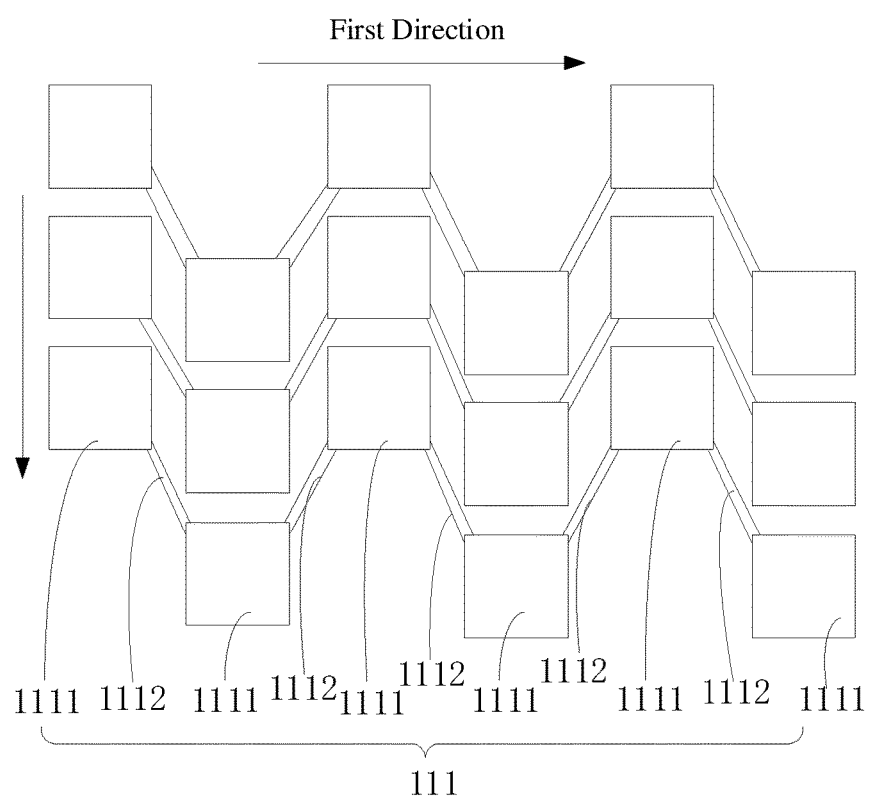
FIG. 4 illustrates a schematic diagram of an orthographic projection of a first electrode of the first display region on an substrate of the display substrate as illustrated in FIG. 1.
Figure 5:
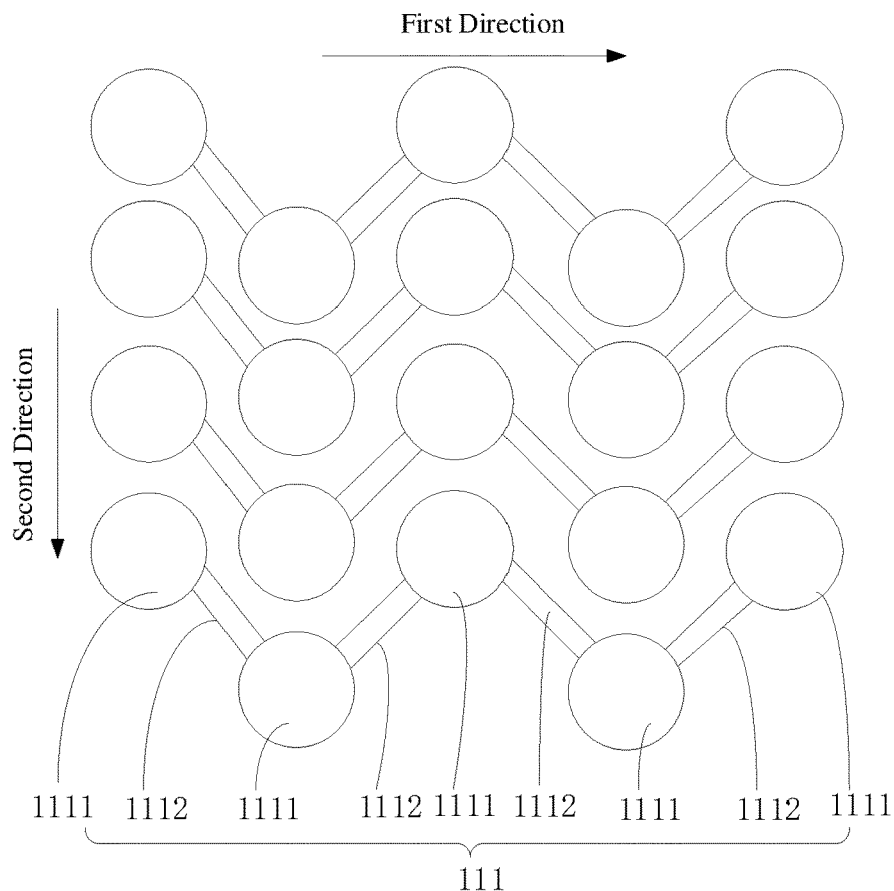
FIG. 5 illustrates a schematic diagram of an orthographic projection of another first electrode of the first display region on the substrate of the display substrate as illustrated in FIG. 1.
Figure 6:
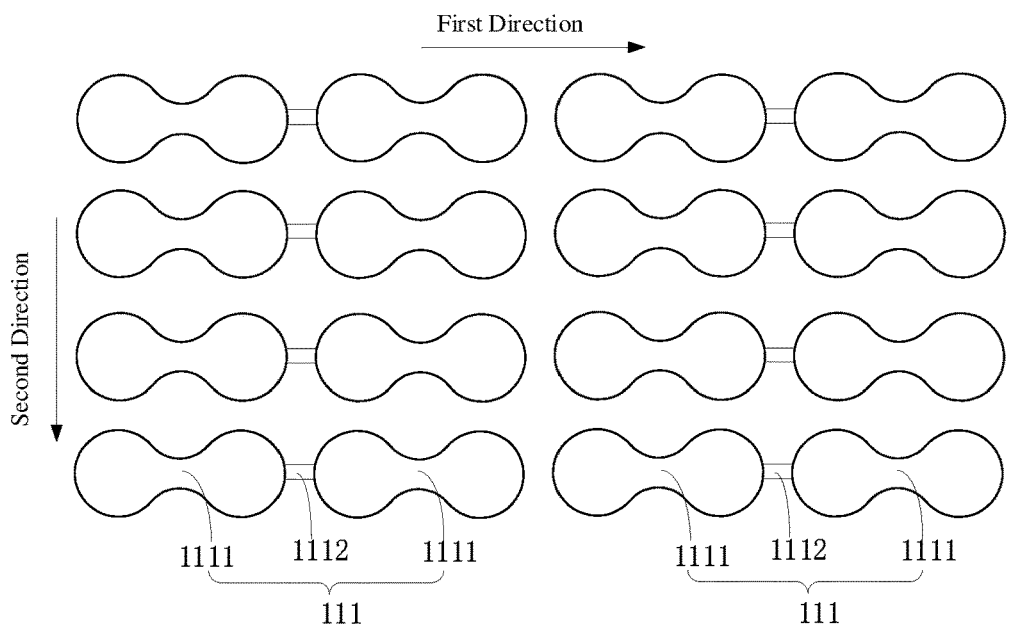
FIG. 6 illustrates a schematic diagram of an orthographic projection of still another first electrode of the first display region on the substrate of the display substrate as illustrated in FIG. 1.

Referring to FIGS. 4 to 6, in a case that the first electrode 111 includes two or more than two electrode blocks 1111, the two or more than two electrode blocks 1111 are arranged at intervals in the first direction, and the first electrode 111 further includes a connecting portion 1112 provided between two adjacent electrode blocks 1111 in the first direction, and the two adjacent electrode blocks 1111 are electrically connected via the connecting portion 1112. With this arrangement, two or more than two electrode blocks 1111 of the first electrode 111 may be driven by one pixel circuit, which can reduce the complexity of the structure of the first display region 10, and can effectively mitigate diffraction superposition generated due to the complex structure of the first display region 10 in a case of light passing through the first display region. Thus, image quality of an image taken by, for example, a camera disposed under the first display region 10 is improved and the defects of image distortion are avoided. In addition, a plurality of electrode block 1111 of one first electrode 111 are electrically connected, so that a plurality of light-emitting structure blocks correspondingly disposed on the plurality of the electrode block 1111 of the first electrode 111 may be controlled to emit light or to be turned off at the same time, and control for the first display region 10 can be simplified.

In an embodiment of the present disclosure, in a case that the first electrode 111 includes two or more than two electrode blocks 1111, a wiring 112 corresponding to the first electrode 111 is electrically connected to one electrode block 1111 of the first electrode 111. Since two or more than two electrode blocks 1111 of one first electrode 111 are electrically connected, it is ensured that all electrode blocks 1111 of the first electrode 111 are driven by one pixel circuit as long as one of the electrode blocks 1111 is connected to the wiring corresponding to the first electrode 111.

In an embodiment of the present disclosure, in a case that the first electrode 111 includes two or more than two electrode blocks 1111, the wiring 112 corresponding to the first electrode 111 may be electrically connected to an electrode block 1111 of the first electrode 111 adjacent to the third display region 30. This arrangement can further reduce the length of the first segment 1121 of the wiring 112, which helps to further mitigate the diffraction effect generated by light passing through the first display region 10.

In an embodiment of the present disclosure, the connecting portion 1112 of the first electrode 111 and the corresponding electrode blocks 1111 of the first electrode 111 are disposed at a same layer, and a size of the connecting portion 1112 in a direction perpendicular to its extending direction or perpendicular to its longitudinal direction is greater than 3 μm and smaller than one half of the maximum size of the electrode block 1111. The resistance of the connecting portion 1112 can be lower by setting the size of the connecting portion 1112 in a direction perpendicular to its extending direction to be greater than 3 μm; the provision of the connecting portion 1112 has a less effect on the size of the electrode block 1111 by setting the size of the connecting portion 1112 to be smaller than one half of the maximum size of the electrode block 1111, the result of a small size of the electrode block 1111 caused by a large size of the connecting portion 1112 can be avoided, and then the decrease of the effective light-emitting area of the first display region 10 can be avoided.

In an embodiment of the present disclosure, the display substrate 100 includes a substrate, the first electrode 111 is disposed on the substrate, and an orthographic projection of the electrode block 1111 on the substrate may include a first graphic unit or a plurality of first graphic units. Wherein a shape of the first graphic unit may include a circle, an oval, a dumbbell, a gourd or a rectangle.

FIG. 4 illustrates that a first electrode 111 is provided in the first display region 10 in the first direction, the first electrode 111 includes six electrode blocks 1111, and an orthographic projection of the electrode block 1111 on the substrate may include a first graphic unit, and the shape of the first graphic unit is a rectangular. FIG. 5 illustrates that a first electrode 111 is provided in the first display region 10 in the first direction. The first electrode 111 includes five electrode blocks 1111, and an orthographic projection of the electrode block 1111 on the substrate may include a first graphic unit, the shape of the first graphic unit is a circle. FIG. 6 illustrates that two first electrodes 111 are provided in the first display region 10 in the first direction, and each of the first electrodes 111 includes two electrode blocks 1111, and an orthographic projection of the electrode blocks 1111 on the substrate may include a first graphic unit, the shape of the first graphic unit is dumbbell. The shape of the first graphic unit may be circular, oval, dumbbell or gourd. The above-mentioned shape may change periodic structure generated by diffraction, that is, change distribution of the diffraction field, thereby reducing the diffraction effect generated in a case that external incident light is passing through the display substrate 100. In addition, in a case that the first graphic unit has any one shape as described above, a size of the first electrode in the second direction changes continuously or discontinuously, and a distance between two adjacent first electrodes in the first direction changes continuously or discontinuously in the second direction, so that positions of diffraction generated by two adjacent first electrodes are different, and intensities of diffraction at different positions cancel out each other, which can effectively reduce the diffraction effect, thereby ensuring, for example, an image taken by the camera disposed below the first display region has a high definition.

In an embodiment of the present disclosure, referring to FIGS. 4 and 5, for a plurality of electrode blocks 1111 of one first electrode 111, two adjacent electrode blocks 1111 are staggered in the first direction, where the first direction is perpendicular to the second direction. Such a configuration can further reduce the diffraction effect generated in a case that external light is passing through the first display region.

In an embodiment of the present disclosure, referring to FIG. 4 and FIG. 5, for more than two electrode blocks 1111 of one first electrode 111, two central axes of the two electrode blocks 1111 that are separated by one electrode block 1111 coincide with each other in the first direction. Such arrangement can make the arrangement of the electrode blocks 1111 more regular, so that the arrangement of the light-emitting structure blocks disposed on the plurality of electrode blocks 1111 is more regular, and arrangement of openings in the mask for preparing the light-emitting structure blocks is more regular. In a case of vapor-depositing the light-emitting structure blocks in the first display region 10 and the third display region 30, the light-emitting structure blocks of the first display region 10 and the third display region 30 may be manufactured in a single vapor deposition process using the same mask. Since the pattern of the mask corresponding to the first display region is relatively uniform, wrinkles may be reduced.

In an embodiment of the present disclosure, the orthographic projection of the light-emitting structure block on the substrate may include a second graphic unit or a plurality of second graphic units, the second graphic unit may be same as the first graphic unit, or the second graphic unit may be different from the first graphic unit. In a case that the first graphic unit is different from the second graphic unit, the orthographic projection of the light-emitting structure block correspondingly disposed on the electrode block 1111 on the substrate is different from the orthographic projection of the electrode block 1111 on the substrate, so as to further mitigate the diffraction effect generated in a case that light is passing through the first display region 10.

Wherein, a shape of the second graphic unit may include a circle, an oval, a dumbbell, a gourd or a rectangle.

In an embodiment of the present disclosure, the first direction and the second direction may be perpendicular to each other. Wherein the first direction may be a row direction, and the second direction may be a column direction. Alternatively, the first direction may be a column direction, and the second direction may be a row direction. In the drawings, for example, take the first direction as the row direction and take the second direction as the column direction, and other cases are not illustrated in the drawings.

In an embodiment of the present disclosure, the density of the first sub-pixel is same as the density of the third sub-pixel. With this arrangement, a display effect of the first display region 10 is more similar to a display effect of the third display region 30, which reduce the probability of inconsistence of display effects of various regions of the display region caused by diversification of pixel density in the display region of the display substrate 100.

Further, the density of the third sub-pixel 31 is equal to one half of the density of the second sub-pixel 21. With this arrangement, the pixel circuit for the first sub-pixel 11 and the pixel circuit for the third sub-pixel 31 each occupy a half of the third display region 30, so that the pixel circuit for the first sub-pixel 11 and the pixel circuit for the third sub-pixel 31 may be arranged reasonably in the third display region 30.

In an embodiment of the present disclosure, a distance between two adjacent third sub-pixels 31 in the third display region 30 is greater than a distance between two adjacent second sub-pixels 21 in the second display region 20, and/or a size of the second sub-pixel 21 is smaller than a size of the third sub-pixel 31. With this arrangement, the density of the second sub-pixels 21 in the second display region 20 can be greater than the density of the third sub-pixels 31 in the third display region 30.

Figure 7:
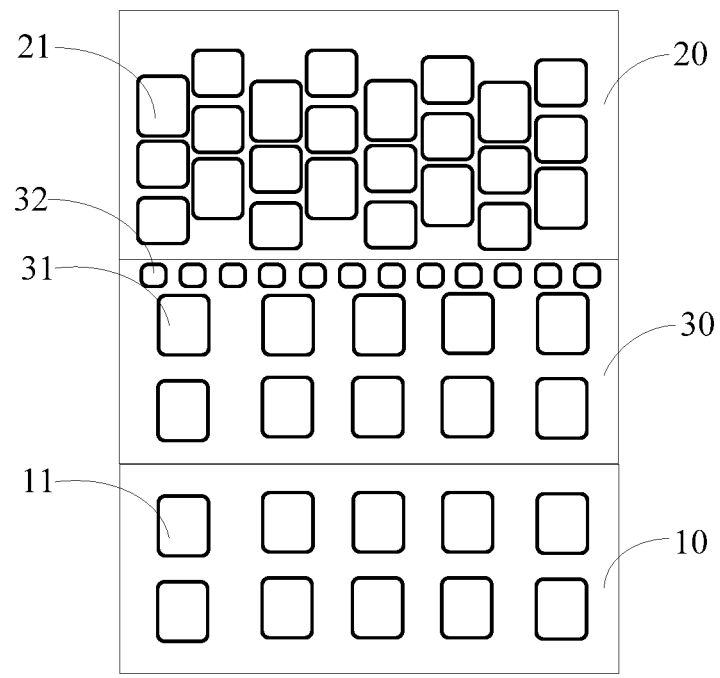
FIG. 7 illustrates a partial schematic diagram of another arrangement of sub-pixels in the display substrate as illustrated in FIG. 1.

In an embodiment of the present disclosure, referring to FIG. 7, a plurality of fourth sub-pixels 32 may be further provided in the third display region 30, a size of the fourth sub-pixel 32 is smaller than a size of the third sub-pixel 31, and the fourth sub-pixel 32 is disposed between the third sub-pixels 31 adjacent to the second display region 20 and the second display region 20, for example, the fourth sub-pixels 32 are disposed between the third sub-pixels 31 located at the edge of the third display region and the second display region 20. By disposing the fourth sub-pixels between the second display region 20 and the third sub-pixels 31 adjacent to the second display region 20, an area of a blank region between the third sub-pixels 31 adjacent to the second display region 20 and the second display region 20 may be reduced, so that a jagged feeling of the third sub-pixel 31 adjacent to the second display region 20 is weak, thereby improving the user experience.

The first display region 10 of the display substrate 100 according to the embodiments of the present disclosure may have a shape such as a drop shape, a circle, a rectangle, a semicircle, a semi-oval, an oval and so on. But it is not limited to this, and the first display region can also be designed to have other shapes according to actual requirements.

The present disclosure further provides a display panel, which includes the display substrate according to any one above-mentioned embodiment of the present disclosure and an encapsulation layer. The encapsulation layer may include a polarizer. The polarizer covers the second display region 20, or the polarizer covers the second display region 20 and the third display region 30, or the polarizer covers the first display region 10, the second display region 20, and the third display region 30.

The polarizer can dissipate reflected light on the surface of the display panel and improve the user experience. In a case that the first display region 10 is not provided with a polarizer, the light transmittance of the first display region 10 can be increased, and proper operation of the photosensitive component disposed under the first display region 10 can be guaranteed, for example.

In an embodiment of the present disclosure, at least a part of the first display region 10 is surrounded by the third display region 30. At least a part of the first display region 10 as illustrated in FIG. 1 is surrounded by the third display region 30. In other embodiments of the present disclosure, instead, the first display region 10 may be completely surrounded by the third display region 30.

In the display panel according to the embodiment of the present disclosure, as the light transmittance of the first display region of the display substrate is greater than the light transmittance of the second display region and the light transmittance of the third display region respectively, full-screen display of the display panel can be realized. And meanwhile, as the pixel circuit for the first sub-pixel in the first display region is disposed in the third display region, complexity of structure of the first display region can be reduced, and the diffraction effect generated in a case that light is passing through the first display region can be mitigated. As the density of the third sub-pixels in the third display region is less than the density of the second sub-pixels in the second display region, it is easier to dispose the pixel circuit for the first sub-pixels in the third display region.

Figure 8:
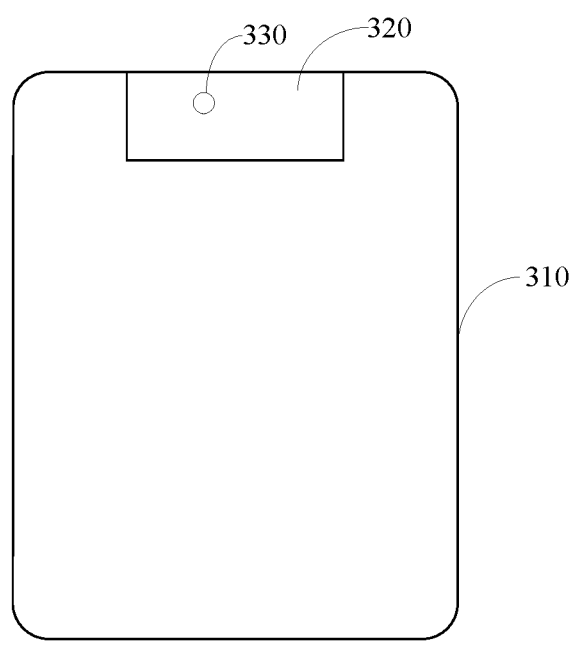
FIG. 8 illustrates a schematic structural view of a device body of the display device according to an embodiment of the present disclosure.

The present disclosure further provides a display device, which includes a device body and the display panel as described above. Referring to FIG. 8, the device body 310 has a component area 320, and the display panel covers the device body 310. The component area 320 is disposed under the first display region 10, and a photosensitive component 330 that emits light or collects light transmitting through the first display region 10 is disposed in the component area 320.

The photosensitive component may include a camera and/or a light sensor. Other components other than photosensitive components, such as gyroscopes or earpieces, can further be disposed in the component area. The component area may be a notch area, and a first display region of the display panel may be arranged in close contact with the notch area, so that the photosensitive component can emit or collect light passing through the first display region.

The above-mentioned display device may be a digital device such as a mobile phone, a tablet PC, a palmtop computer, and an iPad.

In the display device according to the embodiments of the disclosure, since the light transmittance of the first display region of the display substrate is greater than the light transmittance of the second display region and the light transmittance of the third display region respectively, the photosensitive component can be disposed under the first display region, so that full-screen display of the display substrate can be achieved while guaranteeing proper operations of the photosensitive component. At meanwhile, as the pixel circuit for the first sub-pixel in the first display region is disposed in the third display region, complexity of structure of the first display region can be reduced, and the diffraction effect generated in a case that light is passing through the first display region can be mitigated. Therefore, the imaging quality of the camera disposed under the first display region can be improved. As the density of the third sub-pixels in the third display region is less than the density of the second sub-pixel in the second display region, it is easier to arrange the pixel circuit for the first sub-pixel in the third display region.

It should be noted that in the figures, the sizes of layers and regions may be exaggerated for clarity of illustration. It should be further understood that, in a case that an element or layer is referred to as being "on" another element or layer, it can be directly on the other element or intervening layers may be present. In addition, it should be understood that, in a case that an element or layer is referred to as being "under" another element or layer, it can be directly under the other element, or there may be one or more than one intervening layer or element. In addition, it should further be understood that in a case that a layer or element is referred to as being "between" two layers or two elements, it can be the only layer between the two layers or two elements, or more than one intervening layer or element may also be present. In addition, the term "layer" refers to a coating covering a desired area, which is not limited by size. The area may be as large as the entire device or as small as a specific functional area (for example, the actual visual display region), or as small as a single sub-pixel.

After considering the specification and practicing the disclosure disclosed herein, one of ordinary skill in the art will easily conceive of other embodiments of the present disclosure. This disclosure is intended to cover any variations, applications, or modifications of this disclosure. These variations, applications, or modifications follow the general principles of this disclosure and include common knowledge or customary technical means in the technical field not disclosed in this disclosure. The description and embodiments are only regarded as exemplary, and the true scope and spirit of the disclosure are defined by the appended claims.

It should be understood that the present disclosure is not limited to the extract structure that has been described above and illustrated in the figures, and various modifications and changes can be made without departing from its scope. The scope of the disclosure is only limited by the appended claims.

The invention claimed is:

1. A display substrate comprising a substrate, comprising:
a first display region provided with a plurality of first sub-pixels disposed on the substrate, and each of the plurality of first sub-pixels further comprising:
a first electrode;
a light-emitting structure disposed on the first electrode;
a second electrode disposed on the light-emitting structure;
a second display region provided with a plurality of second sub-pixels disposed on the substrate; and
a third display region provided with a plurality of third sub-pixels disposed on the substrate, the third display region disposed contiguous to both the first display region and the second display region;
wherein a light transmittance of the first display region is greater than a light transmittance of the second display region and a light transmittance of the third display region respectively; a density of the plurality of second sub-pixels is greater than a density of the plurality of third sub-pixels and a density of the plurality of first sub-pixels respectively; and
a pixel circuit for driving the plurality of first sub-pixels is disposed in the third display region, wherein the first electrode of each of the plurality of first sub-pixels is electrically connected to a corresponding pixel circuit via a wiring, and the wiring comprises a first segment and a second segment which are connected with each other, and the first segment is disposed in the first display region, and the second segment is disposed in the third display region, and the first segment is made of a transparent conductive material.

2. The display substrate according to claim 1, wherein a light transmittance of at least one of the first electrode and the first segment is greater than 70%.

3. The display substrate according to claim 1, wherein the first segment and the second segment are disposed at a same layer, and the first segment and the second segment are lapped.

4. The display substrate according to claim 1, wherein the first display region further comprises a conductive layer, a resistivity of the conductive layer is lower than a resistivity of the first electrode and a resistivity of the first segment respectively, and the first electrode is connected to the first segment via the conductive layer.

5. The display substrate according to claim 4, wherein a width of the conductive layer changes continuously or discontinuously in an extending direction of the conductive layer.

6. The display substrate according to claim 1, wherein the pixel circuit for the plurality of first sub-pixels is disposed in an area of the third display region contiguous to the first display region, and a pixel circuit for the plurality of third sub-pixels is disposed in an area of the third display region contiguous to the second display region.

7. The display substrate according to claim 1, wherein the pixel circuit for the plurality of first sub-pixels is one of a 1T circuit, a 2T1C circuit, a 3T1C circuit, a 7T1C circuit and a 7T2C circuit.

8. The display substrate according to claim 1, wherein the first electrode comprises at least one electrode block;
in a case that the first electrode comprises two or more than two electrode blocks, the two or more than two electrode blocks are arranged at intervals in the first direction, and the first electrode further comprises a connecting portion disposed between two adjacent electrode blocks and electrically connecting the two adjacent electrode blocks, wherein
the first direction is a row direction or a column direction.

9. The display substrate according to claim 8, wherein in the case that the first electrode comprises two or more than two electrode blocks, the wiring corresponding to the first electrode is electrically connected to an electrode block of the first electrode.

10. The display substrate according to claim 9, wherein the wiring corresponding to the first electrode is electrically connected to an electrode block of the first electrode adjacent to the third display region.

11. The display substrate according to claim 8, wherein a connecting portion of the first electrode and at least two corresponding electrode blocks are disposed at a same layer, and a size of the connecting portion in a direction perpendicular to an extending direction of the connecting portion is greater than 3 μm and smaller than one half of the maximum size of a corresponding electrode block.

12. The display substrate according to claim 8, wherein an orthographic projection of each of the electrode blocks on the substrate comprises at least one first graphic unit; and
the light-emitting structure comprises at least one light-emitting structure block disposed correspondingly on the at least one electrode block, and an orthographic projection of each light-emitting structure block on the substrate comprises at least one second graphic unit, wherein the second graphic unit is same as or different from the first graphic unit.

13. The display substrate according to claim 12, wherein for two or more than two electrode blocks of one first electrode, two adjacent electrode blocks are staggered in the first direction.

14. The display substrate according to claim 13, wherein for more than two electrode blocks of the one first electrode, two central axes of two electrode blocks which are separated by an electrode block coincide with each other in the first direction.

15. The display substrate according to claim 1, wherein the density of the plurality of first sub-pixels is same as the density of the plurality of third sub-pixels.

16. The display substrate according to claim 1, wherein a distance between adjacent third sub-pixels in the third display region is greater than a distance between adjacent second sub-pixels in the second display region; and/or, a size of each of the plurality of second sub-pixels is smaller than a size of each of the plurality of third sub-pixels.

17. The display substrate according to claim 15, wherein the density of the plurality of third sub-pixels is equal to one half of the density of the plurality of second sub-pixels.

18. The display substrate according to claim 1, wherein a plurality of fourth sub-pixels are further provided in the third display region, and the plurality of fourth sub-pixels are disposed between the third sub-pixels adjacent to the second display region and the second display region, and a size of each of the plurality of fourth sub-pixels is smaller than a size of each of the plurality of third sub-pixels.

19. A display panel, comprising:
the display substrate according to claim 1; and
an encapsulation layer;
wherein the encapsulation layer comprises a polarizer, the polarizer is disposed in one manner of followings:
the polarizer covering the second display region;
the polarizer covering the second display region and the third display region; and
the polarizer covering the first display region the second display region, and the third display region.

20. A display device, comprising:
a device body provided with a component area; and
the display panel according to claim 19, and the display panel covering the device body;
wherein the component area is disposed under the first display region, and a photosensitive component that emits light or collects light passing through the first display region is disposed in the component area.

* * * * *